United States Patent
Ishihara et al.

(10) Patent No.: US 10,541,189 B2
(45) Date of Patent: Jan. 21, 2020

(54) HEAT DISSIPATION COMPONENT FOR SEMICONDUCTOR ELEMENT

(71) Applicant: DENKA COMPANY LIMITED, Tokyo (JP)

(72) Inventors: Yosuke Ishihara, Omuta (JP); Takeshi Miyakawa, Omuta (JP); Hiroaki Ota, Omuta (JP); Hideo Tsukamoto, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 16/474,690

(22) PCT Filed: Nov. 24, 2017

(86) PCT No.: PCT/JP2017/042209
§ 371 (c)(1),
(2) Date: Jun. 28, 2019

(87) PCT Pub. No.: WO2018/123380
PCT Pub. Date: Jul. 5, 2018

(65) Prior Publication Data
US 2019/0341330 A1   Nov. 7, 2019

(30) Foreign Application Priority Data

Dec. 28, 2016   (JP) ................. 2016-255584

(51) Int. Cl.
*H01L 23/373*   (2006.01)
*C23C 18/32*   (2006.01)
(Continued)

(52) U.S. Cl.
CPC ............ *H01L 23/373* (2013.01); *C22C 26/00* (2013.01); *C23C 18/32* (2013.01); *C25D 7/12* (2013.01)

(58) Field of Classification Search
None
See application file for complete search history.

(56) References Cited

U.S. PATENT DOCUMENTS 10,302,375 B2 * 5/2019 Ishihara .................... C22C 1/05
10,358,704 B2 * 7/2019 Ishihara .................. B32B 15/01
(Continued)

FOREIGN PATENT DOCUMENTS

GB     2 212 516 A     7/1989
JP     H01-132072 A    5/1989
(Continued)

OTHER PUBLICATIONS

Feb. 6, 2018 Search Report issued in International Application No. PCT/JP2017/042209.

*Primary Examiner* — Jack S Chen
(74) *Attorney, Agent, or Firm* — Oliff PLC (57) ABSTRACT

A sheet-shaped aluminum-diamond composite containing a prescribed amount of a diamond powder wherein a first and second peak in a volumetric distribution of particle sizes occurs at 5-25 μm and 55-195 μm, and a ratio between an area of a volumetric distribution of particle sizes of 1-35 μm and 45-205 μm is from 1:9 to 4:6, the composite including an aluminum-containing metal as the balance, wherein the composite is covered, on both main surfaces, with a surface layer having prescribed film thicknesses and containing 80 vol % or more of an aluminum-containing metal, two or more Ni-containing layers are formed on at least the surface layer, the Ni-containing layers being such that a first and second layer from the surface layer side are amorphous Ni alloy layers having prescribed thicknesses, and an Au layer having a prescribed thickness is formed as an outermost layer.

8 Claims, 1 Drawing Sheet

(51) Int. Cl.
  *C25D 7/12* (2006.01)
  *C22C 26/00* (2006.01)

(56) References Cited

U.S. PATENT DOCUMENTS

| | | |
|---|---|---|
| 2011/0123821 A1 | 5/2011 | Hirotsuru et al. |
| 2014/0182824 A1 | 7/2014 | Hirotsuru et al. |
| 2017/0130300 A1 | 5/2017 | Ishihara et al. |
| 2017/0268834 A1* | 9/2017 | Ishihara .................. C22C 26/00 |

FOREIGN PATENT DOCUMENTS

| | | |
|---|---|---|
| JP | H04-294009 A | 10/1992 |
| JP | H09-157773 A | 6/1997 |
| JP | 2000-303126 A | 10/2000 |
| JP | 2010-176863 A | 8/2010 |
| JP | 2014-107468 A | 6/2014 |
| WO | 2010/007922 A1 | 1/2010 |
| WO | 2013/015158 A1 | 1/2013 |
| WO | 2016/002925 A1 | 1/2016 |

* cited by examiner

HEAT DISSIPATION COMPONENT FOR SEMICONDUCTOR ELEMENT

TECHNICAL FIELD

The present invention relates to a heat dissipation component for a semiconductor element.

BACKGROUND ART

Generally, in semiconductor elements such as semiconductor laser elements and high-frequency elements that are used in optical communications and the like, the problem of how to efficiently remove the heat generated by said elements is very important for preventing malfunctions and the like. In recent years, advances in semiconductor element technologies have resulted in elements with higher outputs, higher speeds and higher integration, placing even stricter demands on the heat dissipation thereof. For this reason, higher thermal conductivity is also generally required in heat dissipation components such as heat sinks, and copper (Cu), which has a high thermal conductivity of 390 W/mK, is used.

Meanwhile, individual semiconductor elements are becoming larger in size with the higher outputs, and the problem of mismatches in the thermal expansion between semiconductor elements and the heat sinks used for heat dissipation has become more prominent. In order to solve these problems, the development of a heat sink material that has the property of high thermal conductivity while also having a coefficient of thermal expansion that matches that of semiconductor elements has been sought. As such materials, composites of metals and ceramics, for example, composites of aluminum (Al) and silicon carbide (SiC), have been proposed (Patent Document 1).

However, the thermal conductivity of an Al—SiC composite will be 300 W/mK or less no matter how the conditions are optimized. Thus, the development of a heat sink material having even higher thermal conductivity, equal to or greater than the thermal conductivity of copper, has been sought. As such a material, a metal-diamond composite combining the high thermal conductivity possessed by diamonds with the high coefficient of linear expansion possessed by metals, and thus having high thermal conductivity and a coefficient of linear expansion close to that of semiconductor element materials, has been proposed (Patent Document 2).

Additionally, in a heat dissipation component for use in a semiconductor element, it is necessary to add a metal layer, by plating or the like, to the surface of the heat dissipation component in order to join it to the element. In the case of a normal semiconductor element, the heat dissipation component is primarily joined by soldering and the joining temperature is 300° C. or lower, so a metal layer is provided by plating an Ni—P alloy or the like on the surface. However, with the higher outputs of semiconductor elements, there are cases in which a semiconductor element and a heat sink material are arranged to be in contact by being joined by using a brazing material or the like in order to efficiently dissipate the heat generated by the semiconductor element. In such applications, due to the elevated joining temperatures and the increase in the temperature load at the time of actual use, when conventional alloy plating such as Ni—P alloy plating is used, the difference in the linear expansion between the heat sink material and the plating film causes blisters to form. For this reason, multilayered plating with Ni layers and amorphous Ni alloy layers has been proposed (Patent Document 3).

CITATION LIST

Patent Literature

Patent Document 1: JP H9-157773 A
Patent Document 2: JP 2000-303126 A
Patent Document 3: JP 2014-107468 A

SUMMARY OF INVENTION

Technical Problem

As mentioned above, in a heat dissipation component for a semiconductor element, it is necessary to add a metal layer, by means of plating or the like, to the surface of the heat dissipation component in order to join it to the element. In particular, with the proliferation of applications in which heat sink materials are used, there is a demand for strict reliability and corrosion resistance under the assumption that the materials are to be used in actual environments, and it is considered to be necessary to form plating films lacking defects such as pinholes. The conventionally proposed plating films have defects such as pinholes, and thus become corroded in salt spray tests simulating corrosion due to long-term use. However, if the film is made thick in order to eliminate defects such as pinholes, there are problems such as reduced reliability due to the formation of blisters, cracks, voids and the like caused by the temperature load during actual use and decreases in the heat dissipation performance.

The present invention addresses the problem of providing an exceptionally reliable and corrosion-resistant heat dissipation component for a semiconductor element, having both high thermal conductivity and a coefficient of linear expansion close to that of a semiconductor element, in which a plating film lacking defects such as pinholes is formed, making it suitable for use as a heat sink or the like in a semiconductor element.

Solution to Problem

The present invention is a heat dissipation component for a semiconductor element, the heat dissipation component comprising a sheet-shaped aluminum-diamond composite containing 50-80 vol % of a diamond powder in which a first peak in a volumetric distribution of particle sizes occurs at 5-25 μm and a second peak occurs at 55-195 μm, and a ratio between an area of a volumetric distribution of particle sizes of 1-35 μm and an area of a volumetric distribution of particle sizes of 45-205 μm is from 1:9 to 4:6, the composite comprising an aluminum-containing metal as the balance; wherein the composite is covered, on both main surfaces, with a surface layer, having a thickness of 0.03-0.2 mm, containing 80 vol % or more of an aluminum-containing metal, two or more Ni-containing layers are formed on at least the surface layer, the Ni-containing layers being such that a first layer from the surface layer side is an amorphous Ni alloy layer having a thickness of 0.1-2.0 μm and a second layer is an amorphous Ni alloy layer having a thickness of 0.5-10.0 μm, furthermore, an Au layer having a thickness of 0.01 μm or more is formed as an outermost layer, and the amorphous Ni alloy layer forming the first layer has a peel strength of 50 N/cm or higher.

In the present invention, Ni layers, Ni alloy layers and Au layers are formed by plating, and the plating films preferably have a peel strength of 50 N/cm or higher. The semiconductor element is preferably a semiconductor laser element or a high-frequency element comprising GaN, GaAs or SiC.

In the present invention, it is preferable for the diamond particles to be aluminum-diamond composites characterized by the presence of β-type silicon carbide layers chemically bonded to the surfaces thereof. It is preferable for the diamond powder to have a β-type silicon carbide layer formed on the surface thereof.

In the present invention, the aluminum-diamond composite is preferably an aluminum-diamond composite produced by liquid-metal forging having a thermal conductivity of 400 W/mK or higher at a temperature of 25° C. and having a coefficient of linear expansion, from 25° C. to 150° C., of $5 \times 10^{-6}$/K to $10 \times 10^{-6}$/K, and both main surfaces have a surface roughness (Ra) of 1 μm or less.

Advantageous Effects of Invention

The heat dissipation component for a semiconductor element comprising the above-mentioned features has both high thermal conductivity and a coefficient of linear expansion close to that of a semiconductor element, and furthermore, is not susceptible to the occurrence of defects such as pinholes in the plating film, and can suppress the occurrence of cracks or the like in temperature cycling tests and corrosion in salt spray tests. Additionally, it is possible to prevent blisters, voids, cracks and the like in the plating film due to the temperature load when joining a semiconductor element. Thus, the heat dissipation component can be favorably used as a heat sink for dissipating heat from a semiconductor element or the like.

DESCRIPTION OF EMBODIMENTS

Explanation of Terminology

In the present description, the symbol "-" refers to "equal to or greater than" and "equal to or less than". For example, "A-B" refers to the range of values that are equal to or greater than A and equal to or less than B.

In the present description, "both surfaces" or "both main surfaces" refers to both the front and rear surfaces of a sheet-shaped member. Additionally, in the present description, "side surfaces" refer to portions of a sheet-shaped member that are approximately perpendicular to both surfaces and that are provided around the periphery of both surfaces.

Embodiment 1

Figure 1:
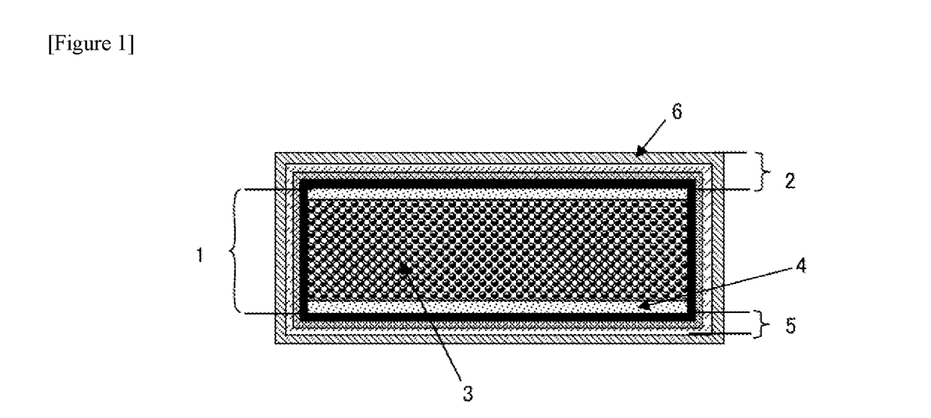
FIG. 1 is a schematic structural diagram of a heat dissipation component for a semiconductor element according to one embodiment.

The heat dissipation component for a semiconductor element (hereinafter also referred to simply as a "heat dissipation component") according to the present embodiment comprises an aluminum-diamond composite (reference number 1 in FIG. 1, hereinafter sometimes referred to simply as "composite") and a surface metal layer (reference number 2 in FIG. 1).

[Aluminum-Diamond Composite]

The aluminum-diamond composite 1 is a sheet-shaped aluminum-diamond composite comprising diamond particles and an aluminum-containing metal. The aluminum-diamond composite 1 comprises a composited portion (reference number 3 in FIG. 1) and a surface layer (reference number 4 in FIG. 1) provided on both surfaces of the composited portion 3. The surface layers 4 comprise a material including an aluminum-containing metal, and the diamond particle (diamond powder) content is 50-80 vol % of the aluminum-diamond composite 1 overall.

(Diamond Powder)

As the diamond powder which is a raw material in the aluminum-diamond composite, either a natural diamond powder or a synthetic diamond powder may be used. Additionally, a binder such as silica, for example, may be added to the diamond powder as needed. By adding a binder, it is possible to obtain the effect of being able to form a molded body.

Regarding the particle sizes of the diamond powder, for the purposes of the thermal conductivity, there is preferably a first peak in the volumetric distribution of particle sizes at 5-25 μm and a second peak in the particle sizes at 55-195 μm, and the ratio between the area of the volumetric distribution of particle sizes of 1-35 μm including the first peak and the area of the volumetric distribution of particle sizes of 45-205 μm including the second peak is preferably from 1:9 to 4:6.

More preferably regarding the particle size distribution, the particle size at the first peak should be 10-20 μm and the particle size at the second peak should be 100-180 μm. Regarding the terms "first peak" and "second peak", in a volumetric distribution of the particle sizes, a peak that is detected on the side with smaller particle sizes is referred to as the "first peak" and a peak that is detected on the larger side is referred to as the "second peak". Additionally, the ratio between the area of the volumetric distribution of particle sizes of 1-35 μm including the first peak and the area of the volumetric distribution of particle sizes of 45-205 μm including the second peak should preferably be a ratio as indicated above for the purposes of increasing the diamond filling amount, and is more preferably 2:8 to 3:7. The particle size distribution is measured by the Coulter method.

The diamond particle (diamond powder) content in the aluminum-diamond composite is preferably 50 vol % or more and 80 vol % or less, more preferably 55 vol % or more, and particularly preferably 60 vol % or more. If the diamond particle content is 50 vol % or more, adequate thermal conductivity can be ensured for the resulting aluminum-diamond composite. Additionally, in view of the filling ability, the diamond particle content should preferably be 80 vol % or less. As long as the content is 80 vol % or less, there is no need to machine the shapes of the diamond particles so as to be spherical or the like, and an aluminum-diamond composite can be obtained at a stable cost.

Furthermore, by using a diamond powder having a β-type silicon carbide layer formed on the surfaces of the diamond particles, it is possible to suppress the generation of metal carbides ($Al_4C_3$) having low thermal conductivity that are formed during the compositing process and to improve the wettability with respect to molten aluminum when producing the aluminum-diamond composite by means of the liquid-metal forging method described below. As a result, the effect of improving the thermal conductivity of the resulting aluminum-diamond composite can be obtained. In other words, the diamond powder is preferably an aluminum-diamond composite characterized by the presence of β-type silicon carbide layers chemically bonded to the surface thereof.

(Aluminum-Containing Metal)

The aluminum-containing metal (aluminum alloy) in the aluminum-diamond composite should preferably have a low melting point in order to be able to sufficiently penetrate into the gaps in the diamond powder (between the diamond particles) during impregnation. Such aluminum alloys include, for example, aluminum alloys containing 5-25 mass % of silicon. By using an aluminum alloy containing 5-25 mass % silicon, it is possible to obtain the effect of promoting the densification of the aluminum-diamond composite.

Furthermore, it is preferable to include magnesium in the above-mentioned aluminum alloy because, by doing so, the diamond particles and ceramic particles can be more strongly bonded with the metal portion. Regarding metal components in the aluminum alloy other than aluminum, silicon and magnesium, there are no particular limits as long as they are within a range in which the properties of the aluminum alloy are not changed in an extreme manner. For example, copper or the like may be included.

(Surface Layers)

The aluminum-diamond composite according to the present embodiment is characterized in that both surfaces of the composited portion (reference number 3 in FIG. 1) are covered with a surface layer (reference number 4 in FIG. 1) comprising a material including an aluminum-containing metal (aluminum alloy).

In this case, the above-mentioned surface layers 4 mainly comprise a material including an aluminum-containing metal, but may include a substance other than the aluminum-containing metal. In other words, the above-mentioned diamond particles and other impurities and the like may be included.

Additionally, the above-mentioned surface layers 4 contain 80 vol % or more of an aluminum-containing metal. If the aluminum-containing metal content is 80 vol % or more, it is possible to employ machining methods that are normally employed in metalworking, and the surface layers 4 may be polished. Furthermore, it is preferable for the aluminum-containing metal content to be 90 vol % or more. If the aluminum-containing metal content is 90 vol % or more, internal impurities or the like will not come free and form polishing scratches when the surface is being polished.

Additionally, the thickness of the surface layers 4 is preferably 0.03 mm or more and 0.2 mm or less in terms of the average thickness. If the average thickness of the surface layers 4 is 0.03 mm or more, the diamond particles will not be exposed during subsequent processes and the targeted surface precision and plating properties can be easily obtained. Additionally, if the average thickness of the surface layers 4 is 0.2 mm or less, the composited portion 3 can occupy a sufficient thickness of the resulting aluminum-diamond composite 1, and sufficient thermal conductivity can be ensured. The average thickness can be measured by using an industrial microscope to observe a cross-section of the aluminum-diamond composite, and measuring the thickness of the surface layer on each of the surfaces at five equidistantly spaced locations including the center point and both ends, then computing the average value thereof.

The thickness of the surface layers 4 may be adjusted by compositing the aluminum alloy by arranging ceramic fibers such as alumina fibers between the diamond powder and the dense mold release plates coated with a mold release agent when filling the diamond powder. Alternatively, the thickness can be adjusted by using aluminum foil instead of ceramic fibers.

Considering the thermal resistance at the joint interface with a target component when used as a heat dissipation component such as a heat sink, the aluminum-diamond composite 1 according to the present embodiment preferably has a smooth surface with a low surface roughness. The surface roughness (Ra) on both main surfaces thereof is preferably 1 μm or less, more preferably 0.5 μm or less. By setting the surface roughness to be 1 μm or less, it is possible to make the thickness of the joint layers uniform and to obtain higher heat dissipation performance. The surface roughness (Ra) can be measured by means of a surface roughness meter.

The planarity and parallelism of the above-mentioned surface layers 4, converted to a size of 10 mm×10 mm, are preferably 0.020 mm or less, more preferably 0.010 mm or less. By having a planarity of 0.030 mm or less, it is possible to make the thickness of the joint layers uniform and thus to obtain higher heat dissipation performance. The planarity and parallelism can be measured by means of a three-dimensional measurer.

Additionally, the sum of the average thicknesses of the surface layers 4 on both surfaces is preferably 20% or less, more preferably 10% or less relative to the thickness of the aluminum-diamond composite 1. If the sum of the average thicknesses of the surface layers 4 on both surfaces is 20% or less relative to the thickness of the aluminum-diamond composite 1, it is possible to obtain sufficient thermal conductivity in addition to surface precision and plating properties.

Additionally, the aluminum-diamond composite 1 should preferably have a thermal conductivity of 400 W/mK or higher when the temperature of the aluminum-diamond composite is 25° C., and should preferably have a coefficient of linear expansion, from 25° C. to 150° C., of $5.0 \times 10^{-6}$/K to $10.0 \times 10^{-6}$/K. The thermal conductivity is a value measured by using the laser flash method, and the coefficient of thermal expansion is a value measured by using a thermal expansion meter.

If the aluminum-diamond composite 1 has a thermal conductivity of 400 W/mK or higher at 25° C. and a coefficient of linear expansion, from 25° C. to 150° C., of $5.0 \times 10^{-6}$/K to $10.0 \times 10^{-6}$/K, a high thermal conductivity and a low coefficient of thermal expansion of about the same level as semiconductor elements is obtained. For this reason, when used as a heat dissipation component such as a heat sink, excellent heat dissipation properties can be obtained, and even when subjected to temperature changes, damage to semiconductor elements can be suppressed because the difference in the coefficient of thermal expansion between the semiconductor elements and the heat-dissipating component is small. As a result thereof, it can be favorably used as a high-reliability heat dissipation component.

(Aluminum-Diamond Composite Production Method)

Herebelow, a method for producing the aluminum-diamond composite according to the present embodiment by a liquid-metal forging method will be described. The methods for producing the aluminum-diamond composite can be largely divided between impregnation and powder metallurgy. Of these, impregnation is more often used in the products that have actually been commercialized, in view of properties such as thermal conductivity. There are also various methods of impregnation, including methods performed at standard pressure, and high-pressure forging which is performed under high pressure. High-pressure forging includes liquid-metal forging and die casting. The preferred method in the present embodiment is high-pressure forging wherein impregnation is performed under high pressure, and liquid-metal forging is preferable in order to obtain a dense composite having excellent properties such as thermal conductivity. Liquid-metal forging generally involves filling a high-pressure container with a powder or molded body of diamond or the like, and impregnating the same with a molten aluminum alloy or the like at a high temperature and a high pressure to obtain the composite material.

In the composite obtained by liquid-metal forging, if the conditions are appropriate, the molten metal thoroughly penetrates into the spaces between the powder, so the proportion of the volume of the powder relative to the fill volume is roughly the same as that of the volume (particle content) of the powder material relative to the volume of the resulting composite overall.

Figure 2:
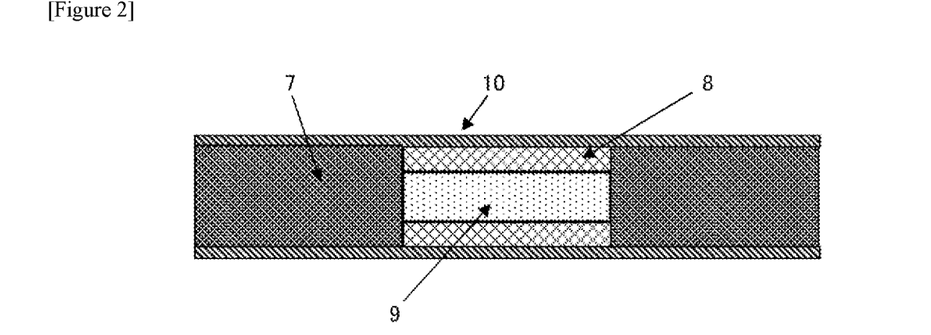
FIG. 2 is a schematic section view of a structure for liquid-metal forging in the production of an aluminum-diamond composite according to one embodiment.

In preparation for liquid-metal forging, a mold member (reference number 7 in FIG. 2) comprising a porous body that can be impregnated with an aluminum alloy, dense mold release plates (reference number 8 in FIG. 2) coated with a mold release agent, and the above-mentioned diamond powder (reference number 9 in FIG. 2) are arranged as shown in FIG. 2, forming a structure for liquid-metal forging, consisting of the mold member 7, the mold release plates 8 and the filled diamond powder 9.

While the aluminum-diamond composite according to the present embodiment is characterized in that both main surfaces are covered with surface layers containing 80 vol % or more of an aluminum-containing metal, the front and rear main surfaces may be formed by arranging ceramic fibers such as alumina fibers between the diamond powder and the mold release plates when filling the above-mentioned structure with the diamond powder to composite the aluminum alloy. Alternatively, it is possible to use aluminum foil instead of ceramic fibers. Furthermore, the thicknesses of the surface layers that are formed may be adjusted by adjusting the thicknesses of the ceramic fibers or aluminum foil that are inserted at this time.

FIG. 2 is a section view of a structure used for liquid-metal forging, the section view being of a portion filled with the diamond powder. When compositing the aluminum alloy and the diamond powder by means of liquid-metal forging, the aluminum alloy reaches the portion filled with the diamond powder by passing through a mold material comprising the above-mentioned porous body.

Mold Member Comprising Porous Body

There are no particular constraints on the material of the mold member 7 comprising a porous body that can be impregnated with the aluminum alloy in the liquid-metal forging process, as long as the porous body can be impregnated with an aluminum alloy by liquid-metal forging. However, the porous body is preferably a porous body of graphite, boron nitride, alumina fibers, or the like, that has excellent heat tolerance and that is capable of stably supplying molten metal.

Mold Release Plates

Furthermore, as the dense mold release plates 8, stainless steel plates or ceramic plates may be used, and there are no particular limitations as long as they are dense bodies that cannot be impregnated with the aluminum alloy during liquid-metal forging. Additionally, regarding the mold release agent that is coated onto the mold release plates, a mold release agent having excellent heat tolerance, such as graphite, boron nitride, and alumina, can be used. Furthermore, mold release plates that can achieve more stable mold release may be obtained by applying the mold release agent after coating the surfaces of the mold release plates with an alumina sol or the like.

The thickness of the aluminum-diamond composite according to the present embodiment may be adjusted by the filling amount of the diamond powder at the time of the compositing process, and the thickness is preferably 0.4-6 mm. If the thickness is 0.4 mm or more, then adequate strength is obtained for use as a heat sink or the like. If the thickness is 6 mm or less, the material itself can be kept from becoming expensive, and the effects such as high thermal conductivity can be sufficiently obtained.

In the present embodiment, the mold release plates 8 that are arranged on both surfaces can be stripped away after compositing to obtain the aluminum-diamond composite. As a result thereof, it is possible to obtain an aluminum-diamond composite having an extremely smooth surface.

As shown in FIG. 2, metal plates (reference number 10 in FIG. 2) may be arranged on both surfaces of the structure. Additionally, if a plurality of structures are to be stacked to form a block, they may be stacked by providing the metal plates 10 between the structures. By arranging the mold release plates in this way, the molten metal can be evenly impregnated, and operations such as removal of the aluminum-diamond composite after the impregnation process can be easily performed.

Multiple structures obtained in this way are further stacked to form a block, and this block is heated at about 560-750° C. Additionally, one or more of the blocks are arranged inside a high-pressure container, and as quickly as possible in order to prevent the temperature of the blocks from dropping, a molten aluminum alloy heated to above the melting point is supplied and pressed at a pressure of 20 MPa or higher.

If the block heating temperature is 560° C. or higher, the aluminum alloy compositing process is stabilized, and an aluminum-diamond composite having sufficient thermal conductivity can be obtained. Additionally, if the heating temperature is 750° C. or lower, the generation of aluminum carbide ($Al_4C_3$) on the diamond powder surface during the aluminum alloy compositing process can be suppressed, and an aluminum-diamond composite having sufficient thermal conductivity can be obtained.

Additionally, regarding the pressure during impregnation, the aluminum alloy compositing process can be made stable and an aluminum-diamond composite having sufficient thermal conductivity can be obtained, as long as the pressure is 20 MPa or higher. More preferably, the impregnation pressure is 50 MPa or higher. If the pressure is 50 MPa or higher, an aluminum-diamond composite having more stable thermal conductivity properties can be obtained.

Anneal Treatment

The aluminum-diamond composite obtained by the above-indicated operation can also be annealed. By performing an anneal treatment, strain in the aluminum-diamond molded body can be eliminated, and an aluminum-diamond composite having more stable thermal conductivity properties can be obtained.

In order to remove only the strain inside the molded body without affecting the surfaces of the resulting aluminum-diamond composite, the anneal treatment is preferably performed for 10 minutes or longer at a temperature of 400-550° C.

Machining Method

Next, an example of a machining method for the aluminum-diamond composite according to the present embodiment will be explained. The above-described aluminum-diamond composite is an extremely hard, difficult-to-work material. For this reason, the aluminum-diamond composite is difficult to normally machine or grind using diamond machine tools, so it is worked by waterjet machining, laser machining or electrical discharge machining.

The aluminum-diamond composite according to the present embodiment may also be machined using normal diamond machine tools or the like, but the material is extremely hard and difficult to work, so it should preferably be machined by waterjet machining, laser machining or electrical discharge machining, in view of the durability of the machine tools and the machining cost. By working the shape by means of these machining methods, it is possible to lower the dimensional error to ±0.100 mm or less.

Working of Surface Layer

The aluminum-diamond composite according to the present embodiment has a structure wherein both main surfaces are covered by surface layers 4 comprising a material including an aluminum-containing metal, so the surface precision (surface roughness: Ra) and the dimensional precision (outer shape, thickness, planarity, parallelism) can be adjusted by machining (polishing) these surface layers 4. These surface layers 4 may be machined by employing a machining method that is used in normal metalworking, and for example, the entire surfaces may be polished using a surface grinder or the like, so as to make the surface roughness Ra 1 μm or less, and to make the planarity and the parallelism 0.010 mm or less over 10 mm×10 mm.

[Surface Metal Layer]

The aluminum-diamond composite according to the present embodiment, when used as a heat sink for a semiconductor element, will often be used by being joined to the semiconductor element by brazing. Thus, a surface metal layer 2 is preferably provided on the joint surface of the aluminum-diamond composite. The surface metal layer 2 includes a layer 5 containing Ni (Ni-containing layer) and an Au layer 6. In other words, the heat dissipation component according to the present embodiment has, formed thereon, surface metal layers 2 comprising two or more Ni-containing layers (reference number 5 in FIG. 1), of which a first layer and a second layer from the surface layer side are amorphous Ni alloy layers, and an Au layer (reference number 6 in FIG. 1) as the outermost layer. As the method of forming the surface metal layer, plating, vapor deposition, sputtering or the like may be employed. Plating is preferred in view of the processing cost. Herebelow, the case in which Ni-containing layers 5 and an Au layer 6 are formed by plating will be described.

(Ni-Containing Layers)

The aluminum-diamond composite 1 has at least two or more layers containing Ni (Ni-containing layers) 5 on an aluminum-containing metal (surface layer 4) on a surface thereof. The expression "Ni-containing layer" includes Ni layers and Ni alloy layers. At least two or more amorphous Ni alloy layers are formed on the surface layer 4. By means of this feature, it is possible to eliminate pinholes. The first and second Ni-containing layers 5 from the surface layer 4 side of the composite should preferably be amorphous Ni alloy layers.

The "first and second layers from the surface layer side" are the first and second layers in the order of closeness to the surface layer 4, the "first layer from the surface layer side" being in contact with the surface layer 4, and the "second layer from the surface layer side" being in contact with the first layer.

The film thickness of the first layer is 0.1-2.0 μm, preferably 0.5-1.5 μm, and particularly preferably 0.7-1.3 μm.

The film thickness of the second layer is 0.5-10 μm, preferably 1.0-8.0 μm, and particularly preferably 2.0-5.0 μm. As with the surface layers described above, the thickness of the surface metal layers (Ni-containing layers, Au layer) refer to the "average thickness", which can be measured by a method similar to that of the surface layers.

Because the first and second Ni-containing layers 5 are amorphous Ni alloy layers, the first amorphous Ni alloy layer having a thickness of 0.1 or more and the second amorphous Ni alloy layer having a thickness of 0.5 or more, defects do not tend to form on the surface metal layers 2 and the formation of pinholes in the plating films can be prevented. Because the thickness of the first amorphous Ni alloy layer is 2.0 μm or less, even if a pinhole is formed in the first layer, the pinhole can be blocked by the plating film of the second layer. By making the film thickness of the second layer 10 μm or less, it is possible to prevent influences on the thermal conduction properties and it is possible to prevent increases in the residual stress generated in the plating film. Additionally, in applications as in the present invention, even when the temperature load during actual use causes the amorphous Ni alloy plating to crystallize, it is possible to keep volume changes at that time from causing microcracks to form, and thereafter, to keep the cracks from expanding, and the plating film from blistering and peeling due to the temperature load. There is no upper limit to the number of Ni plating layers as long as it is within a range not affecting the thermal conduction properties and raising the cost due to the increased number of processing steps. Crystalline Ni plating layers may be formed as third and subsequent layers by electroplating or the like.

Regarding the plating method, the first and second amorphous Ni alloy layers from the surface layer 4 side of the composite 1 are preferably formed by electroless plating, in which case the Ni alloy plating is generally alloy plating containing 5-15 wt % Ni and phosphorus (P).

Furthermore, when Ni-plating aluminum, a pretreatment such as zinc substitution is necessary, and it is preferable to perform zinc substitution, which provides excellent plating adhesion. The adhesion of the Ni plating should preferably be such that the peel strength is 50 N/cm or higher, more preferably 78 N/cm or higher, and particularly preferably 85 N/cm or higher. Since the peel strength is 50 N/cm or higher, when used as a heat dissipation component for a semiconductor element, it is possible to suppress the occurrence of problems in which the temperature load at the time of actual use causes the plating layer to peel. The method for measuring the peel strength may be the method described in the examples indicated below.

(Au Layer)

The aluminum-diamond composite 1 has Au layers 6 formed as at least the outermost layers on both main surfaces. When the aluminum-diamond composite 1 is to be joined by brazing at a high temperature, an Au plating layer having a film thickness of 0.01 μm or more is formed on the outermost surface by means of electroplating or electroless plating. The film thickness of the Au plating layer is preferably 0.01-4 μm and more preferably 1.0-3.0 μm. Since the plating film thickness is 0.01 μm or more, it can be firmly joined to a semiconductor element. Regarding the upper limit, there are no constraints in terms of the properties, but it should preferably be no more than 4 μm due to the fact that Au plating is extremely expensive. Additionally, the Au plating layer may be formed as multilayer plating by flash Au-plating to a thickness of approximately 0.01-0.05 μm, then plating up by electroplating to a thickness of 4 μm.

[Semiconductor Element]

The aluminum-diamond composite having the above-described structure has a high thermal conductivity and a coefficient of thermal expansion close to that of a semiconductor element, has a small dimensional error and planarity, and lacks pinholes in the plating film and thus provides airtightness as a packaging material. For this reason, the aluminum-diamond composite is suitable for use as a heat dissipation component for a semiconductor element, such as a heat-dissipating heat sink for a semiconductor element.

Thus, the heat dissipation component for a semiconductor element of the present embodiment has high thermal conductivity and a low coefficient of thermal expansion of about the same level as that of a semiconductor element, and is suitable for use as a heat dissipation component in semiconductor laser elements or high-frequency elements requiring high outputs such as GaN, GaAs and SiC. In particular, the present embodiment is suitable for use as a heat dissipation component in a GaN-HEMT element or a GaAs-HEMT element, these being high-frequency elements.

The aluminum-diamond composite and the heat dissipation component using the same according to the present invention, and the production methods thereof, have been explained by referring to an embodiment above, but the present invention is not limited thereto.

EXAMPLES

Examples 1 to 17 and Comparative Examples 1 to 11

A high-purity diamond powder A (manufactured by Diamond Innovations; average particle size 150 μm) and a high-purity diamond powder B (manufactured by Diamond Innovations; average particle size 15 μm), both of which are commercially available, were mixed at a weight ratio of 7:3. The peaks in the volumetric distributions of the particle sizes of the respective powders were observed at the same positions as the average particle sizes. Upon measuring the particle size distribution of the mixed powder containing the diamond powder A and the diamond powder B, in the volumetric distribution, the ratio of the area of the volumetric distribution for 1-35 μm to the area of the volumetric distribution for 45-205 μm was 3:7. The particle size distribution was measured by adding the diamond powders to pure water to produce a slurry as the measurement solution, then measuring the measurement solution with a spectrophotometer (manufactured by Beckman Coulter: Coulter LS230) using a refractive index of 1.33 for water and a refractive index of 2.42 for diamond. The ratio of the areas in the volumetric distribution was computed by means of the ratio of the cumulative distribution at prescribed particle sizes.

A diamond powder was produced by mixing together 50 g of the resulting mixed powder, 16 g of silica powder (average particle size 5 μm) and 16 g of silicon powder (average particle size 10 μm), then loading the mixture into a silicon carbide crucible, and subjecting the mixture to a heat treatment for 3 hours at a temperature of 1450° C. in an argon atmosphere to form a layer of β-type silicon carbide on the diamond powder surface.

Next, 40×40×2 mmt stainless steel plates (SUS 430 material) were coated with an alumina sol and baked for 30 minutes at 350° C., after which a graphite-based mold release agent was applied to the surfaces to produce mold release plates (reference number 8 in FIG. 2). Then, the diamond powder obtained above was loaded so as to be sandwiched between the surfaces of the mold release plates 8, with pure aluminum foil having a thickness of 0.05 mm being disposed above and below, inside an isotropic graphite tool (reference number 7 in FIG. 2) having a porosity of 20%, having a 40×40×8 mmt cavity in the center and external dimensions of 60×60×8 mmt, thereby forming a structure.

A plurality of the above-mentioned structures were stacked, interposed by 60×60×1 mmt stainless steel plates (reference number 10 in FIG. 2) coated with a graphite-based mold release agent, and iron plates having a thickness of 12 mm were arranged on both sides thereof, and connected by six M10 bolts that were tightened using a torque wrench with a planar-direction tightening torque of 10 Nm to form a single block.

Next, the resulting block was preheated to a temperature of 650° C. in an electric furnace, then placed in a preheated press mold having an interior size of 300 mm, and a molten aluminum alloy, containing 12 mass % of silicon and 1 mass % of magnesium, at a temperature of 800° C., was poured in and pressed for 20 minutes at a pressure of 100 MPa to impregnate the diamond powder with the aluminum alloy. After cooling the block to room temperature, a wet handsaw was used to cut the block along the shape of the mold release plates, and the sandwiched stainless steel plates were stripped away. Thereafter, an anneal treatment was performed for 3 hours at a temperature of 530° C. in order to eliminate strain generated during impregnation, so as to obtain an aluminum-diamond composite.

The resulting aluminum-diamond composite was polished on both surfaces using #600 polishing paper, then buffed.

Next, the aluminum-diamond composite was machined to a shape of 25×25×2 mmt using a waterjet cutter (Sugino Machine Abrasive Jet Cutter NC), with a pressure of 250 MPa and a cutting speed of 50 mm/min, using garnets with a grain size of 100 μm as the abrasive grains.

A cross-section of the resulting aluminum-diamond composite was observed with an industrial microscope, and the thicknesses of the surface layers (reference number 4 in FIG. 1) on both surfaces were measured at five equidistantly spaced locations including the center point and both ends, and the average thickness was determined, as a result of which the value was 0.055 mm for both samples. Additionally, the surface roughness (Ra) as measured by means of a surface roughness meter was 0.32 μm.

The resulting aluminum-diamond composite was used to measure the thermal conductivity at 25° C. by the laser flash method (Rigaku LF/TCM-8510B), and also, samples (3×2×10 mm) for measuring the coefficient of thermal expansion were prepared from the resulting aluminum-diamond composite by means of waterjet cutting, and the coefficient of thermal expansion for temperatures from 25-150° C. was measured using a thermal expansion meter (Seiko Electronics TMA300). As a result thereof, it was determined that the thermal conductivity was 587 W/mK and the coefficient of thermal expansion was $7.0 \times 10^{-6}$/K.

The density of the resulting aluminum-diamond composite was measured at room temperature, 25° C., by means of the Archimedean method, and the Vf (diamond particle content) was computed by using a mixing rule, as a result of which it was found to be 62 vol % (diamond density 3.52 g/cm$^3$; aluminum alloy density 2.7 g/cm$^3$).

Additionally, after the above-mentioned aluminum-diamond composite was ultrasonically cleaned, then pretreated with a Zn catalyst, a plating film as indicated in Table 1 was formed. For Comparative Example 11, a plating film was formed without performing the pretreatment by means of the Zn catalyst.

The peel strength was measured for the resulting plated product and a salt spray test and a heat cycling test were performed. The results thereof are shown in Table 2. The peel strength was measured by masking the surface of the aluminum-diamond composite on which the plating film was formed, using heat-resistant tape, while leaving a 5 mm-wide measuring portion unmasked. A copper plate having a thickness of 0.25 mm and a width of 5 mm was soldered to the measuring portion, and the peel strength was computed by measuring the tensile strength using a digital force gauge to pull the copper plate in the direction perpendicular to the measurement surface at a pulling speed of 20 mm/min. The salt spray test was performed for 24 hours in accordance with the JIS H8502 standard, and it was determined whether or not corrosion occurred by using a magnifying glass (10× magnification) to look for the occurrence of peeling or blisters on the plating film. The heat cycling test was performed by implementing 100 hot-cold cycles from −55° C. to 125° C. (in air, held at each temperature for 10 minutes), then using an industrial microscope (100× magnification) to observe the plating surface for the presence or absence of cracks.

TABLE 1

| | Plating Layer Structure (formed sequentially from left) |
|---|---|
| Example 1 | Electroless Ni—P (0.1 μm) + electroless Ni—P (3.0 μm) + Au (2.0 μm) |
| Example 2 | Electroless Ni—P (2.0 μm) + electroless Ni—P (3.0 μm) + Au (2.0 μm) |
| Example 3 | Electroless Ni—P (2.0 μm) + electroless Ni—P (3.0 μm) + Au (0.01 μm) |
| Example 4 | Electroless Ni—P (2.0 μm) + electroless Ni—P (3.0 μm) + Au (4.0 μm) |
| Example 5 | Electroless Ni—P (1.0 μm) + electroless Ni—P (0.5 μm) + Au (2.0 μm) |
| Example 6 | Electroless Ni—P (1.0 μm) + electroless Ni—P (10.0 μm) + Au (2.0 μm) |
| Example 7 | Electroless Ni—P (0.1 μm) + electroless Ni—P (0.5 μm) + Au (2.0 μm) |
| Example 8 | Electroless Ni—P (1.0 μm) + electroless Ni—P (3.0 μm) + Au (2.0 μm) |
| Example 9 | Electroless Ni—P (2.0 μm) + electroless Ni—P (10.0 μm) + Au (2.0 μm) |
| Example 10 | Electroless Ni—P (0.5 μm) + electroless Ni—P (1.0 μm) + Au (2.0 μm) |
| Example 11 | Electroless Ni—P (0.5 μm) + electroless Ni—P (5.0 μm) + Au (2.0 μm) |
| Example 12 | Electroless Ni—P (1.0 μm) + electroless Ni—P (3.0 μm) + electroplated Ni (2.0 μm) + Au (2.0 μm) |
| Example 13 | Electroless Ni—P (1.0 μm) + electroless Ni—P (1.0 μm) + electroplated Ni (2.0 μm) + Au (2.0 μm) |
| Example 14 | Electroless Ni—P (1.0 μm) + electroless Ni—P (1.0 μm) + electroplated Ni (2.0 μm) + Au (2.0 μm) |
| Example 15 | Electroless Ni—P (1.0 μm) + electroless Ni—P (1.0 μm) + electroplated Ni (2.0 μm) + electroplated Ni (2.0 μm) + Au (2.0 μm) |
| Example 16 | Electroless Ni—P (1.0 μm) + electroless Ni—P (1.0 μm) + electroless Ni—P (2.0 μm) + electroplated Ni (2.0 μm) + Au (2.0 μm) |
| Example 17 | Electroless Ni—P (1.0 μm) + electroless Ni—P (1.0 μm) + electroplated Ni (2.0 μm) + electroless Ni—P (2.0 μm) + electroplated Ni (2.0 μm) + Au (2.0 μm) |
| Comparative Example 1 | Electroless Ni—P (5.0 μm) |
| Comparative Example 2 | Electroplated Ni (5.0 μm) |
| Comparative Example 3 | Electroplated Ni (1.0 μm) + electroless Ni—P (3.0 μm) + Au (2.0 μm) |
| Comparative Example 4 | Electroplated Ni (2.0 μm) + electroless Ni—P (2.0 μm) + Au (2.0 μm) |
| Comparative Example 5 | Electroless Ni (1.0 μm) + electroplated Ni (3.0 μm) + Au (2.0 μm) |
| Comparative Example 6 | Electroless Ni—P (0.05 μm) + electroless Ni—P (3.0 μm) + Au (2.0 μm) |
| Comparative Example 7 | Electroless Ni—P (3.0 μm) + electroless Ni—P (3.0 μm) + Au (2.0 μm) |
| Comparative Example 8 | Electroless Ni—P (1.0 μm) + electroless Ni—P (0.3 μm) + Au (2.0 μm) |
| Comparative Example 9 | Electroless Ni—P (1.0 μm) + electroless Ni—P (12.0 μm) + Au (2.0 μm) |
| Comparative Example 10 | Electroless Ni—P (2.0 μm) + electroless Ni—P (3.0 μm) + Au (0.005 μm) |
| Comparative Example 11 | Electroless Ni—P (2.0 μm) + electroless Ni—P (3.0 μm) + Au (2.0 μm) |

TABLE 2

| | Peel Strength (N/cm) | Salt Spray Test (plating film peeled or blistered) | Heat Cycling Test (presence of cracks) | GaN Semiconductor Element Joint State |
|---|---|---|---|---|
| Example 1 | 98 | no | no | good |
| Example 2 | 90 | no | no | good |
| Example 3 | 95 | no | no | good |
| Example 4 | 90 | no | no | good |
| Example 5 | 90 | no | no | good |
| Example 6 | 96 | no | no | good |
| Example 7 | 95 | no | no | good |
| Example 8 | 95 | no | no | good |
| Example 9 | 93 | no | no | good |
| Example 10 | 93 | no | no | good |
| Example 11 | 92 | no | no | good |
| Example 12 | 95 | no | no | good |
| Example 13 | 90 | no | no | good |
| Example 14 | 90 | no | no | good |
| Example 15 | 95 | no | no | good |
| Example 16 | 90 | no | no | good |
| Example 17 | 90 | no | no | good |
| Comparative Example 1 | 95 | yes | no | good |
| Comparative Example 2 | 95 | yes | no | good |
| Comparative Example 3 | 95 | yes | no | good |
| Comparative Example 4 | 93 | yes | no | good |
| Comparative Example 5 | 95 | yes | no | good |
| Comparative Example 6 | 90 | yes | no | good |
| Comparative Example 7 | 93 | yes | no | good |
| Comparative Example 8 | 90 | yes | no | good |
| Comparative Example 9 | 90 | no | yes | good |
| Comparative Example 10 | 91 | no | no | voids present |
| Comparative Example 11 | 30 | no | no | plating blisters |

In Comparative Examples 1 to 8, corrosion was observed as a result of the salt spray test (24 hours), and in Comparative Example 9, there were cracks in the plating surface after the heat cycling test (100 cycles), so these composites are not suitable for use as a heat sink material for a semiconductor element.

Examples 1 to 17 and Comparative Examples 1 to 11 were joined with a GaN semiconductor element using AuSn solder, and the states of the joints were observed by means of an ultrasonic flaw detection device. The results are shown in Table 2. In Comparative Example 10, the joint was inadequate, and in Comparative Example 11, the plating film blistered due to the temperature load during the joining process, so these composites are not suitable for use as heat sink materials for semiconductor elements. In Examples 1 to 17, corrosion was not observed during the salt spray test and cracks were not observed during the heat cycling test, and the states of the joints were good, so these composites are suitable for use as heat sink materials in semiconductor elements.

Examples 18 to 23 and Comparative Examples 12 to 14

Examples 18 to 23 and Comparative Examples 12 to 14 were produced using the same method as Example 1 except that the insert materials described in Table 3 were arranged, as insert materials, above and below the diamond powder. In Comparative Example 14, alumina fibers (porosity 70%) were used as the insert material, and in this case, only 70 vol % of the aluminum-containing metal was contained in the surface layer.

The resulting aluminum-diamond composites were polished in the same manner as Example 1, machined to obtain aluminum-diamond composites having a shape with dimensions of 25×25×2 mmt, and cross-sections of these aluminum-diamond composites were observed under an industrial microscope. The results of measurement of the average thicknesses of the surface layers (reference number 4 in FIG. 1) on both surfaces and the surface roughnesses (Ra) measured with a surface roughness meter are shown in Table 3.

Furthermore, the properties of the resulting aluminum-diamond composites were evaluated in the same manner as in Example 1, and the results thereof are shown in Table 3.

formed. Examples 18 to 23, in which plating films were formed, were evaluated in a manner similar to Example 1. The results thereof are shown in Table 4. In Examples 18 to 23, corrosion was not observed during the salt spray test and cracks were not observed during the heat cycling test, and the states of the joints were good, so these composites are suitable for use as heat sink materials in semiconductor elements.

TABLE 4

|  | Peel Strength (N/cm) | Salt Spray Test (plating film peeled or blistered) | Heat Cycling Test (presence of cracks) | GaN Semi-conductor Element Joint State |
|---|---|---|---|---|
| Example 18 | 92 | no | no | good |
| Example 19 | 95 | no | no | good |
| Example 20 | 97 | no | no | good |
| Example 21 | 98 | no | no | good |
| Example 22 | 90 | no | no | good |
| Example 23 | 90 | no | no | good |

While the present invention was explained in further detail by providing examples above, the present invention is not to be construed in a limiting manner due to these examples.

REFERENCE SIGNS LIST

1 Aluminum-diamond composite
2 Surface metal layer
3 Composited portion
4 Surface layer
5 Ni-containing layer

TABLE 3

|  | Insert Material | Thickness of Insert Material (mm) | Average Thickness of Surface Layer (mm) | Surface Roughness Ra (µm) | Thermal Cond. (W/mK) | Coeff. of Thermal Expansion (×10$^{-6}$/K) | Vf (vol %) |
|---|---|---|---|---|---|---|---|
| Example 18 | pure aluminum foil | 0.035 | 0.040 | 0.32 | 570 | 7.0 | 62.5 |
| Example 19 | pure aluminum foil | 0.100 | 0.100 | 0.32 | 562 | 7.2 | 61 |
| Example 20 | pure aluminum foil | 0.150 | 0.155 | 0.28 | 562 | 7.5 | 60.5 |
| Example 21 | pure aluminum foil | 0.200 | 0.200 | 0.25 | 530 | 7.9 | 55.5 |
| Example 22 | alumina fiber (porosity: 86%) | 0.100 | 0.100 | 0.35 | 555 | 7.5 | 61 |
| Example 23 | alumina fiber (porosity: 90%) | 0.150 | 0.150 | 0.38 | 560 | 7.6 | 60 |
| Comparative Example 12 | pure aluminum foil | 0.005 | 0.005 | 0.3 | 589 | 7.0 | 63 |
| Comparative Example 13 | pure aluminum foil | 0.250 | 0.250 | 0.3 | 395 | 10.3 | 48 |
| Comparative Example 14 | alumina fiber (porosity: 70%) | 0.100 | 0.100 | 1.3 | 545 | 7.5 | 61 |

In Comparative Example 13, the diamond particle content was 50 vol % or less, the thermal conductivity was 400 W/mK or less and the coefficient of thermal expansion was 10.0×10$^{-6}$/K or higher. Additionally, in Comparative Example 14, the surface roughness after polishing was high, and there were polishing scratches caused by ceramic fibers coming loose, so subsequent evaluations were not performed.

Additionally, after the above-mentioned aluminum-diamond composite was ultrasonically cleaned, a plating layer was formed under conditions similar to those in Example 1. In Comparative Example 12, non-adhesion of the plating was observed and subsequent evaluations were not per-

6 Au layer
7 Mold material comprising porous body
8 Mold release plate coated with mold release material
9 Diamond powder
10 Metal plate

The invention claimed is:

1. A heat dissipation component for a semiconductor element, the heat dissipation component comprising:
    a sheet-shaped aluminum-diamond composite containing 50-80 vol % of a diamond powder in which a first peak in a volumetric distribution of particle sizes occurs at 5-25 µm and a second peak occurs at 55-195 µm, and
    a ratio between an area of a volumetric distribution of particle sizes of 1-35 μm and an area of a volumetric distribution of particle sizes of 45-205 μm is from 1:9 to 4:6, the composite comprising an aluminum-containing metal as the balance; wherein the composite is covered, on both main surfaces, with a surface layer, having a thickness of 0.03-0.2 mm, containing 80 vol % or more of an aluminum-containing metal, two or more Ni-containing layers are formed on at least the surface layer, the Ni-containing layers being such that a first layer from the surface layer side is an amorphous Ni alloy layer having a thickness of 0.1-2.0 μm and a second layer is an amorphous Ni alloy layer having a thickness of 0.5-10.0 μm, furthermore, an Au layer having a thickness of 0.01 μm or more is formed as an outermost layer, and the amorphous Ni alloy layer forming the first layer has a peel strength of 50 N/cm or higher.

2. The heat dissipation component for a semiconductor element as in claim 1, wherein the diamond powder has a β-type silicon carbide layer formed on a surface thereof.

3. The heat dissipation component for a semiconductor element as in claim 1, wherein the aluminum-diamond composite has a thermal conductivity of 400 W/mK or higher at a temperature of 25° C. and has a coefficient of linear expansion, from 25° C. to 150° C., of $5 \times 10^{-6}$/K to $10 \times 10^{-6}$/K, and both main surfaces have a surface roughness (Ra) of 1 μm or less.

4. The heat dissipation component for a semiconductor element as in claim 1 that is used by being joined with a high-frequency element comprising GaN, GaAs or SiC.

5. The heat dissipation component for a semiconductor element as in claim 2, wherein the aluminum-diamond composite has a thermal conductivity of 400 W/mK or higher at a temperature of 25° C. and has a coefficient of linear expansion, from 25° C. to 150° C., of $5 \times 10^{-6}$/K to $10 \times 10^{-6}$/K, and both main surfaces have a surface roughness (Ra) of 1 μm or less.

6. The heat dissipation component for a semiconductor element as in claim 2 that is used by being joined with a high-frequency element comprising GaN, GaAs or SiC.

7. The heat dissipation component for a semiconductor element as in claim 3 that is used by being joined with a high-frequency element comprising GaN, GaAs or SiC.

8. The heat dissipation component for a semiconductor element as in claim 5 that is used by being joined with a high-frequency element comprising GaN, GaAs or SiC.

* * * * *